(12) United States Patent
Voiron et al.

(10) Patent No.: US 10,903,538 B2
(45) Date of Patent: Jan. 26, 2021

(54) DISTRIBUTED LC FILTER STRUCTURE

(71) Applicant: Murata Manufacturing Co., Ltd., Nagaokakyo (JP)

(72) Inventors: Frédéric Voiron, Barraux (FR); Mohamed Mehdi Jatlaoui, Ouistreham (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/728,403

(22) Filed: Dec. 27, 2019

(65) Prior Publication Data

US 2020/0136221 A1 Apr. 30, 2020

Related U.S. Application Data

(63) Continuation of application No. PCT/IB2018/000690, filed on Jun. 29, 2018.

(30) Foreign Application Priority Data

Jun. 30, 2017 (EP) ..................................... 17305846

(51) Int. Cl.
*H01P 1/20* (2006.01)
*H01L 23/66* (2006.01)
*H02M 1/44* (2007.01)

(52) U.S. Cl.
CPC ................ *H01P 1/20* (2013.01); *H01L 23/66* (2013.01); *H02M 1/44* (2013.01); *H01L 2223/6627* (2013.01)

(58) Field of Classification Search
CPC combination set(s) only.
See application file for complete search history.

(56) References Cited

U.S. PATENT DOCUMENTS

| 6,552,696 B1 * | 4/2003 | Sievenpiper | H01Q 3/44 343/700 MS |
| 6,731,184 B1 * | 5/2004 | Muto | H04B 1/48 333/103 |

(Continued)

FOREIGN PATENT DOCUMENTS

WO 2007054858 A2 5/2007

OTHER PUBLICATIONS

International Search Report issued for PCT/IB2018/000690, dated Dec. 13, 2018.

(Continued)

*Primary Examiner* — Adam D Houston
(74) *Attorney, Agent, or Firm* — Arent Fox LLP

(57) ABSTRACT

A distributed LC filter structure is disclosed. The distributed LC filter structure provides simultaneously a distributed inductance and a distributed capacitance in the same structure. Accordingly, discrete passive elements are eliminated and high, homogenous integration is achieved. Interconnections between the distributed inductance and the distributed capacitance are tailored to leverage a parasitic inductance of the distributed capacitance to increase the overall inductance of the distributed LC filter structure. Similarly, the interconnections are tailored to leverage a parasitic capacitance resulting from the distributed inductance to add up with the distributed capacitance augmenting the overall capacitance of the structure.

20 Claims, 12 Drawing Sheets

(56) References Cited

U.S. PATENT DOCUMENTS

| | | | | |
|---|---|---|---|---|
| 6,864,669 | B1* | 3/2005 | Bucur | H02J 7/0013 323/268 |
| 2002/0070423 | A1* | 6/2002 | Takafuji | H01L 21/4853 257/532 |
| 2006/0086998 | A1* | 4/2006 | Nagaoka | H01L 29/66734 257/500 |
| 2007/0218699 | A1* | 9/2007 | Yoshida | H01L 21/7681 438/710 |
| 2007/0246805 | A1* | 10/2007 | Zhang | H01L 25/0657 257/659 |
| 2009/0242977 | A1* | 10/2009 | Kawaguchi | H01L 29/66666 257/330 |
| 2009/0261897 | A1* | 10/2009 | Bobde | H01L 27/0259 327/552 |
| 2010/0164079 | A1* | 7/2010 | Dekker | H01L 24/16 257/676 |
| 2011/0037540 | A1* | 2/2011 | Matsushita | H03H 7/09 333/204 |
| 2011/0234354 | A1* | 9/2011 | Kawarai | H01F 27/36 336/136 |
| 2012/0146182 | A1 | 6/2012 | Oganesian | |
| 2012/0146717 | A1 | 6/2012 | Bobde | |
| 2013/0146345 | A1* | 6/2013 | Kajihara | H05K 1/165 174/258 |
| 2017/0104057 | A1 | 4/2017 | Voiron | |
| 2018/0205309 | A1* | 7/2018 | Bleus | H03K 17/133 |
| 2020/0136221 | A1* | 4/2020 | Voiron | H01L 23/66 |
| 2020/0228073 | A1* | 7/2020 | Naniwa | H03F 1/565 |

OTHER PUBLICATIONS

Written Opinion of the International Searching Authority issued for PCT/IB2018/000690, dated Dec. 13, 2018.

Voiron, F.; "Silicon High-Density Capacitors for Power Decoupling Applications"; 2015 IEEE International Workshop on Integrated Power Packaging, IEEE, May 3, 2015, pp. 48-51.

Jatlaoui, M.; "New Ultra Low ESR Mosaïc PICS Capacitors for Power Conversion"; 2015 10th European Microwave Integrated Circuits Conference (EUMIC), EUMA, Sep. 7, 2015, pp. 203-206.

\* cited by examiner

DISTRIBUTED LC FILTER STRUCTURE

CROSS REFERENCE TO RELATED APPLICATIONS

The present application is a continuation of PCT/IB2018/000690 filed Jun. 29, 2018, which claims priority to European Patent Application No. 17305846.2, filed Jun. 30, 2017, the entire contents of each of which are incorporated herein by reference.

FIELD OF THE INVENTION

The present invention relates to integrated filter structures including inductance and capacitance components.

BACKGROUND

Internet of Things ("IoT") applications using communicating devices that are increasingly small, smart, and autonomous have been emerging recently. These applications are expected to drive innovation in the field of electronic integration for the next decade. Specifically, with key features of IoT devices being cost, size, and efficiency, the provision of highly efficient, highly integrated power supply circuitry is a main focus of research in IoT applications.

In the general area of power supply, linear regulators have been replaced for many years now by switched inductive DC-DC buck converters operating at increasingly high frequencies. FIG. 1 is a circuit diagram that illustrates an example output stage 100 of a buck DC-DC converter. As shown in FIG. 1, output stage 100 includes a series inductor 102, a shunt capacitor 104, and a load 106. Inductor 102 is coupled between an input terminal and an output terminal of output stage 100. Typically, inductor 102 is associated with a parasitic resistance 110. Capacitor 104 is coupled in parallel to load 106, between the output terminal and a ground terminal. Typically, capacitor 104 is associated with a parasitic resistance 112 and a parasitic inductance 114.

In one filtering application, a square wave input signal 108 is provided at the input terminal, for example by a switch. Input signal 108 is integrated by inductor 102 to produce a triangular wave signal. Capacitor 104 filters the triangular wave signal to generate a low-swing sinusoidal output signal across load 106.

Attempts at "Silicon In Package" integration of buck converters have been limited. On one hand, this is because, conventionally, inductor 102 and capacitor 104 are made of discrete devices that cannot be easily integrated in package and/or above silicon for technological (e.g., thickness discrepancies, thermal expansion differences, etc.) and reliability reasons. Furthermore, with poor ESL (Equivalent Series Inductance) performance, integration with discrete passive components is limited in switching frequency to prevent unacceptable efficiency loss. However, as operating frequencies continue to increase, allowing for increasingly smaller passive values, interest in buck converter integration has been renewed.

Some efforts have focused on reducing inductor size and enhancing inductor leakage performance. Other efforts have been directed at reducing ESR (Equivalent Series Resistance) and ESL for capacitive components. For example, FIG. 2 is a cross-section view of a DC-DC converter 200 based on a Passive Integrated Common Substrate (PICS®) core distributed LC filter. As shown in FIG. 2, converter 200 includes a distributed capacitor structure 206 embedded in a silicon interposer 202. Distributed capacitor structure 206 is designed to have reduced parasitics (i.e., low ESR and ESL). A discrete inductor 208 is stacked on top of distributed capacitor structure 206 to form a lumped LC filter. A Power Management Integrated Circuit (PMIC) 204 is flip-chip bonded onto silicon interposer 202 such that the lumped LC filter is located closely under PMIC 204, reducing stray capacitance and allowing an ultra-low converter profile. Using such a design, a high efficiency converter operating at frequencies up to 100 MHz can be achieved.

However, thus far, prior approaches have tended to optimize the inductor and the capacitor separately, leading to inefficient, heterogeneous integration of components manufactured in different process technologies, especially for low power converters. In addition, in PICS® designs such as shown in FIG. 2, efforts have focused on minimizing or cancelling the inductance resulting from distributed capacitor structure 206, treating it as a parasitic.

SUMMARY OF THE INVENTION

In one aspect, certain embodiments of the present invention enable a distributed LC filter structure providing simultaneously a distributed inductance and a distributed capacitance in the same structure. Accordingly, discrete passive elements are eliminated and high, homogenous integration is achieved. In certain embodiments according to another aspect of the invention, rather than treating the inductance resulting from the distributed capacitance as a parasitic (and attempting to reduce it), these embodiments tailor the interconnections between the distributed inductance and capacitance to leverage this parasitic inductance to increase the overall inductance of the distributed LC filter structure. Similarly, the interconnections between the distributed inductance and capacitance are tailored to leverage the parasitic capacitance resulting from the distributed inductance to add up with the distributed capacitance augmenting the overall capacitance of the structure.

In an embodiment, the present invention provides a distributed LC filter structure. The distributed LC filter structure includes a substrate having a trench etched in a top surface thereof; a first conductive layer disposed in the trench; a first insulator-metal structure disposed in the trench on top of the first conductive layer, the first insulator-metal structure comprising a first insulator layer disposed on top of the first conductive layer and a second conductive layer disposed on top of the first insulator layer; a second insulator-metal structure disposed in the trench on top of the first insulator-metal structure, the second insulator-metal structure comprising a second insulator layer disposed on top of the second conductive layer and a third conductive layer disposed on top of the second insulator layer; a first insulation layer deposited along the top surface of the substrate; a first metal layer deposited on top of the first insulation layer; a second insulation layer deposited on top of the first metal layer; a second metal layer deposited on top of the second insulation layer; a first contact array connecting the first conductive layer to the first metal layer; a second contact array connecting the second conductive layer to the second metal layer; and a third contact array connecting the third conductive layer to the first metal layer.

In an embodiment, the first conductive layer, the second conductive layer, and the third conductive layer provide first, second, and third electrodes, respectively, that form a first capacitive cell of the distributed LC filter. In another embodiment, the first, second, and third electrodes form a second capacitive cell of the distributed LC filter in parallel with the first capacitive cell. In a further embodiment, in at least one of the first and second capacitive cells, the first and second electrodes form a first capacitance and the second and third electrodes form a second capacitance in parallel with the first capacitance.

In an embodiment, the second metal layer provides an inductance of the distributed LC filter structure. In another embodiment, at least one of the first contact array, the second contact array, and the third contact array is configured such that a parasitic inductance of at least one of the first and second capacitive cells is coupled in series with the inductance provided by the second metal layer. Such coupling augments the overall inductance of the distributed LC filter structure providing greater filtering performance.

In an embodiment, the first and second capacitive cells underlie the entire length of the second metal layer, thereby forming a uniformly distributed LC structure. In an alternative embodiment, the first and second capacitive cells underlie only a portion of the entire length of the second metal layer, thereby forming a non-uniformly distributed LC structure.

In an embodiment, the distributed LC filter structure includes one of a L+LC, a LC+L, or a L+LC+L filter. The L only portion of such distributed filter structures includes only an inductive component provided by the second metal layer but no capacitive cells underlying the inductive component.

In an embodiment, the second metal layer of the distributed LC filter structure has a length and a width, the length being larger than the width by a factor of at least 100.

In an embodiment, the first metal layer is connected to a ground terminal and the second metal layer is connected to an input signal terminal.

In an embodiment, the first contact array, the second contact array, and the third contact array have equal contact density. Alternatively or additionally, the first contact array, the second contact array, and the third contact array have equal pitch. In another embodiment, the first contact array, the second contact array, and the third contact array have equal contact surface.

In an embodiment, the distributed LC filter structure is coupled to a Power Management Integrated Circuit (PMIC) flip-chip bonded onto the substrate.

In an embodiment, the distributed LC filter structure is used in a DC-DC converter such as a buck converter.

Other features, elements, characteristics, and advantages of the present invention will become more apparent from the following detailed description of embodiments with reference to the attached drawings.

BRIEF DESCRIPTION OF THE DRAWINGS

The accompanying drawings illustrate certain embodiments of the present invention and, together with the description, serve to inform a person skilled in the art regarding how to put the invention into effect.

The present disclosure will be described with reference to the accompanying drawings. Generally, the drawing in which an element first appears is typically indicated by the leftmost digit(s) in the corresponding reference number.

DETAILED DESCRIPTION OF THE EMBODIMENTS

Exemplary embodiments of the present invention overcome the deficiencies of prior solutions. In one aspect, the embodiments enable a distributed LC filter structure providing simultaneously a distributed inductance and a distributed capacitance in the same structure. Accordingly, discrete passive elements are eliminated and high, homogenous integration is achieved. In another aspect, rather than treating the inductance resulting from the distributed capacitance as a parasitic (and attempting to reduce it), embodiments tailor the interconnections between the distributed inductance and capacitance to leverage this parasitic inductance to increase the overall inductance of the distributed LC filter structure. Similarly, the interconnections between the distributed inductance and capacitance are tailored to leverage the parasitic capacitance resulting from the distributed inductance to add up with the distributed capacitance augmenting the overall capacitance of the structure.

Figure 1:
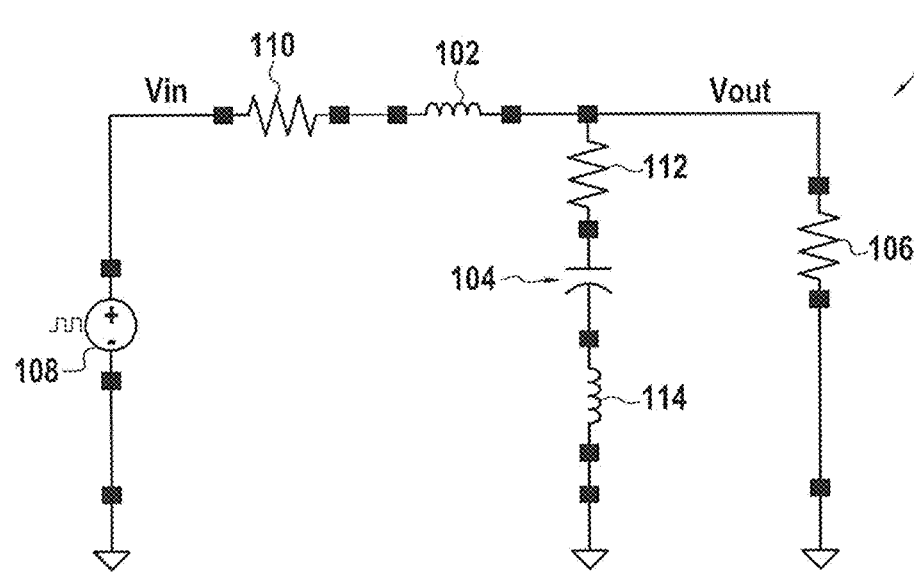
FIG. 1 is a circuit diagram that illustrates an example output stage of a buck DC-DC converter.
Figure 2:
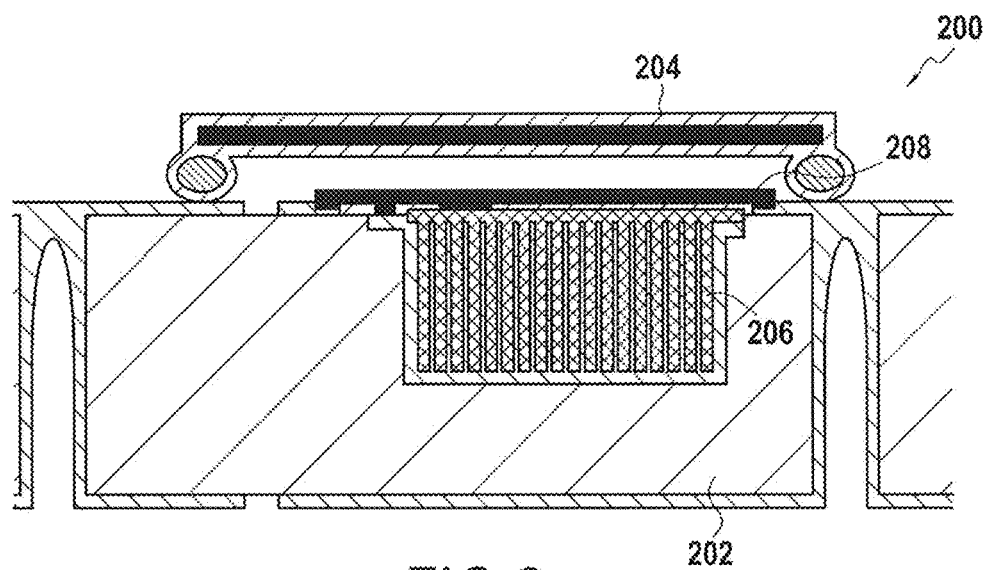
FIG. 2 is a cross-section view of an example DC-DC converter based on a PICS® core lumped LC filter.
Figure 3:
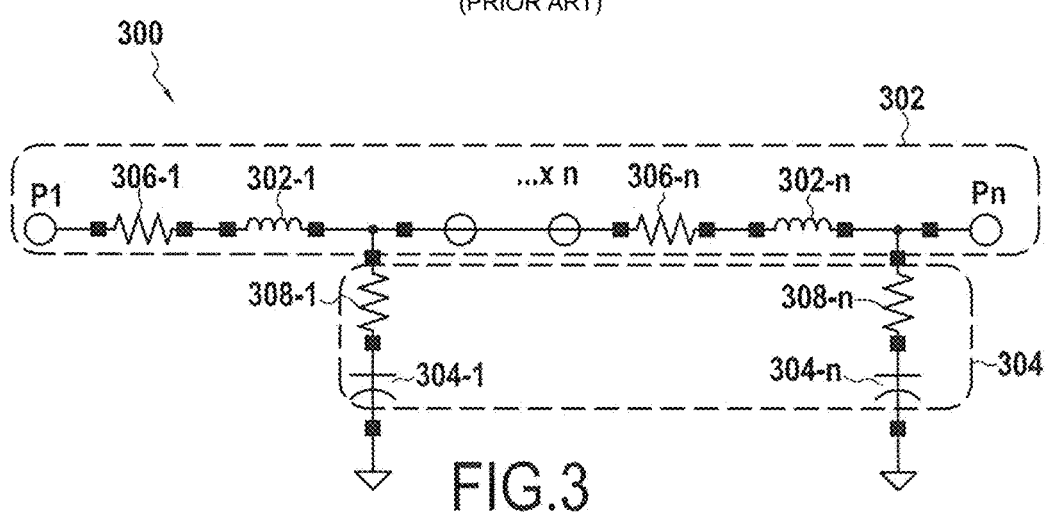
FIG. 3 is a circuit diagram that illustrates an example distributed LC filter structure according to an exemplary embodiment.

FIG. 3 is a circuit diagram that illustrates an example distributed LC filter structure 300 according to an exemplary embodiment. In general, distributed LC filter structure 300 may be used as a low-pass filter, for example. In an embodiment, distributed LC filter structure 300 may be used as an output filtering stage of a DC-DC buck converter. In another embodiment, distributed LC filter structure 300 is coupled to a Power Management Integrated Circuit (PMIC) flip-chip bonded onto a substrate.

As shown in FIG. 3, example LC filter structure 300 includes a distributed inductor 302 and distributed capacitor 304. Distributed inductor 302 includes a plurality of series inductive components 302-1, . . . , 302-$n$. Each inductive component 302-1, . . . , 302-$n$ may have an associated parasitic resistance 306-1, . . . , 306-$n$. Distributed capacitor 304 includes a plurality of parallel capacitive components 304-1, . . . , 304-$n$. Each capacitive component 304-1, . . . , 304-$n$ may have an associated parasitic resistance 308-1, . . . , 308-$n$. Accordingly, distributed LC filter structure 300 is based on serializing the filter inductor in the horizontal path and parallelizing the shunt capacitor in the vertical path.

The plurality of inductive components 302-1, . . . , 302-$n$ may each further include a respective parasitic capacitance, and the plurality of capacitive components 304-1, . . . , 304-$n$ may each further include a respective parasitic inductance. In an embodiment (not shown in FIG. 3), interconnections between distributed inductor 302 and distributed capacitor 304 are made such that, in addition to enabling the circuit shown in FIG. 3, they allow the parasitic capacitances of the plurality of inductive components 302-1, . . . , 302-n to be coupled in parallel with the plurality of capacitive components 304-1, . . . , 304-n. Additionally or alternatively, in another embodiment, the interconnections between distributed inductor 302 and distributed capacitor 304 are made such that the parasitic inductances of the plurality of capacitive components 304-1, . . . , 304-n are coupled in series with the plurality of inductive components 302-1, . . . , 302-n. Accordingly, rather than attempting to reduce the parasitic inductance of the shunt capacitor and/or the parasitic capacitance of the filter inductor, the parasitics are leveraged to increase the filter inductance and/or the shunt capacitance of the LC filter. Performance of the resulting LC filter is thereby improved.

Figure 4:
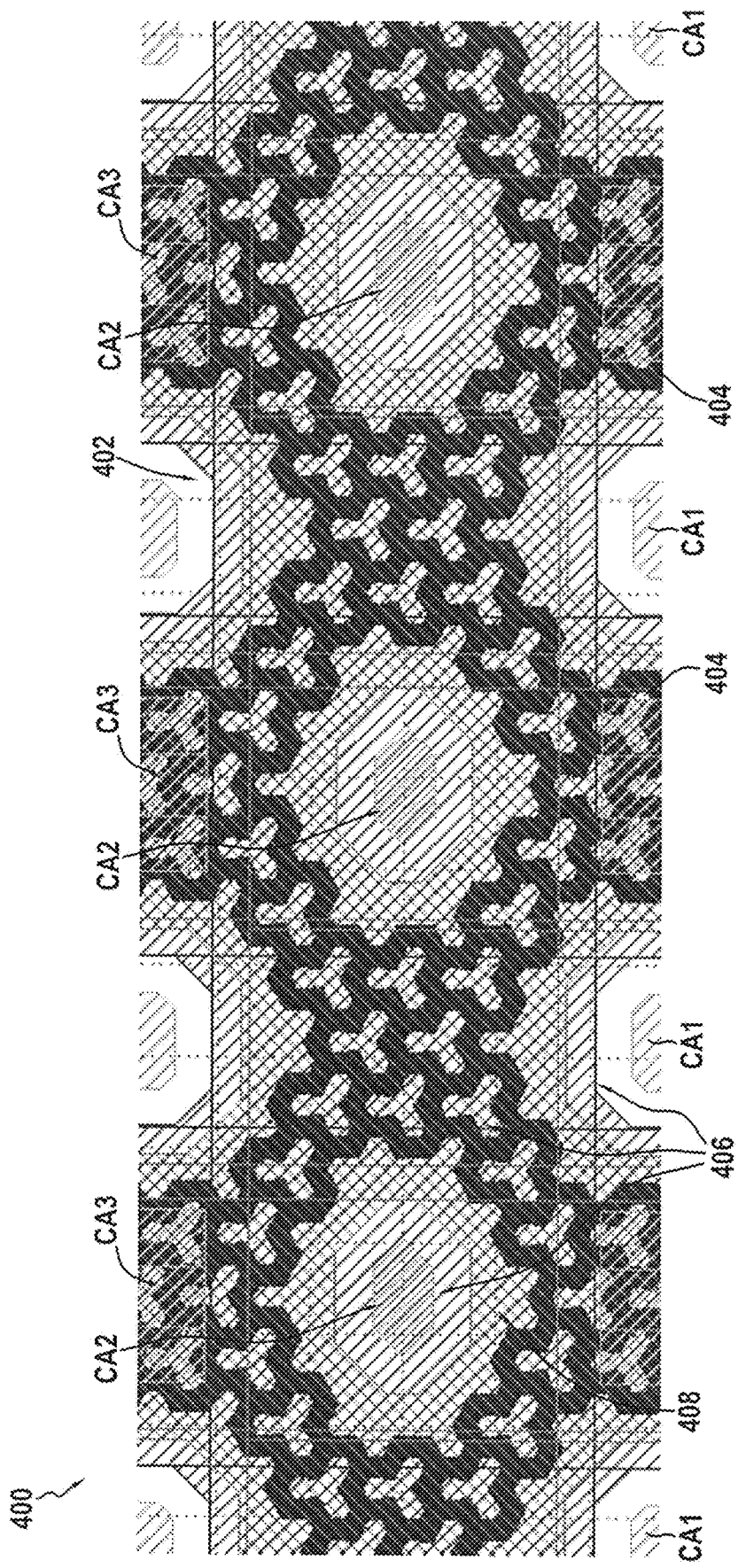
FIG. 4 is a top view of a first pattern layout of an example distributed LC filter structure according to an exemplary embodiment.
Figure 5:
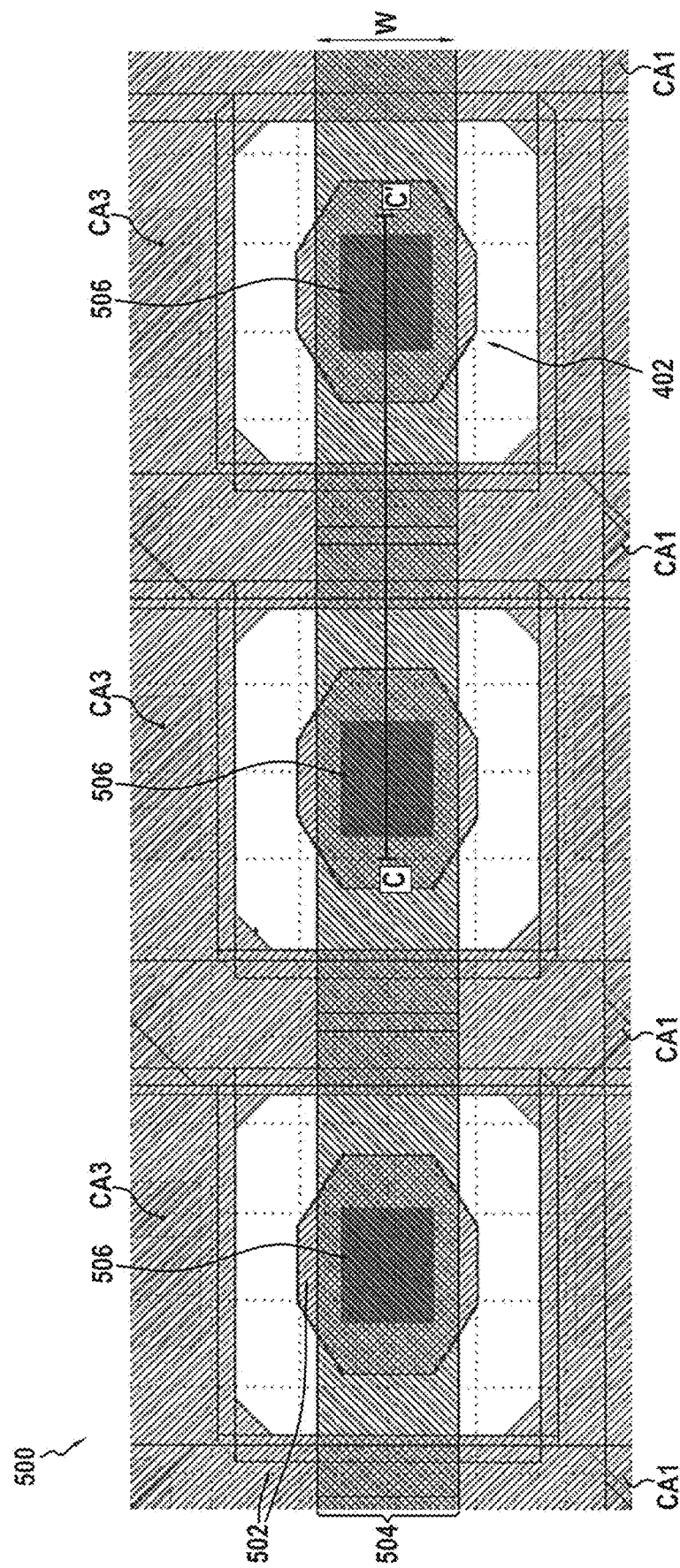
FIG. 5 is a top view of a second pattern layout of an example distributed LC filter structure according to an exemplary embodiment.

FIGS. 4 and 5, further described below, illustrate pattern layouts of an example distributed LC filter structure according to an exemplary embodiment. The distributed LC filter structure illustrated in FIGS. 4 and 5 may be an embodiment of distributed LC filter structure 300.

FIG. 4 is a top view of a first pattern layout 400 of the example distributed LC filter structure. First pattern layout 400 shows the layouts of a trench pattern 404, a first conductive layer 402, a second conductive layer 406, and a third conductive layer 408 of the LC filter structure. In an embodiment, first conductive layer 402, second conductive layer 406, and third conductive layer 408 provide first, second, and third electrodes that form at least one capacitive cell of the LC filter structure. For the purpose of presentation, intervening layers, such as isolation layers between the different conductive layers, are omitted.

Figure 10A:
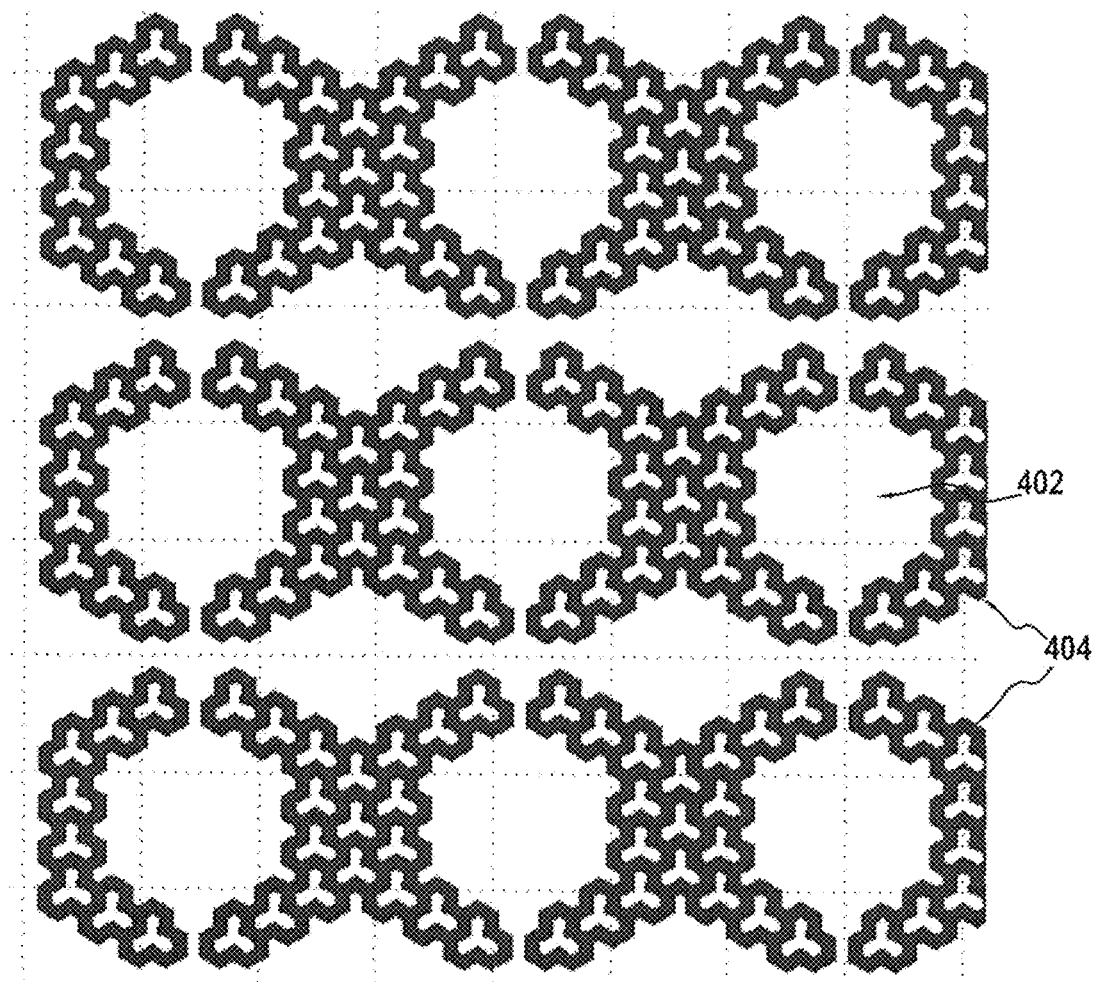
FIGS. 10A-G are top views illustrating a series of pattern layouts that may be used to form a distributed LC filter structure according to an exemplary embodiment.

In an exemplary embodiment, trench pattern 404 is formed by etching a top surface of a substrate. First conductive layer 402 is then disposed over the top surface of the substrate and into the trenches formed by trench pattern 404. A pattern layout resulting from first conductive layer 402 and trench pattern 404 is illustrated in FIG. 10A. Trench pattern 404 allows to extend, vertically into the substrate, the surfaces of the capacitors formed by the LC filter structure. As such, the capacitance of the resulting LC filter structure is increased. In another embodiment, however, the LC filter structure can be formed without etching trench pattern 404 into the substrate.

Figure 10B:
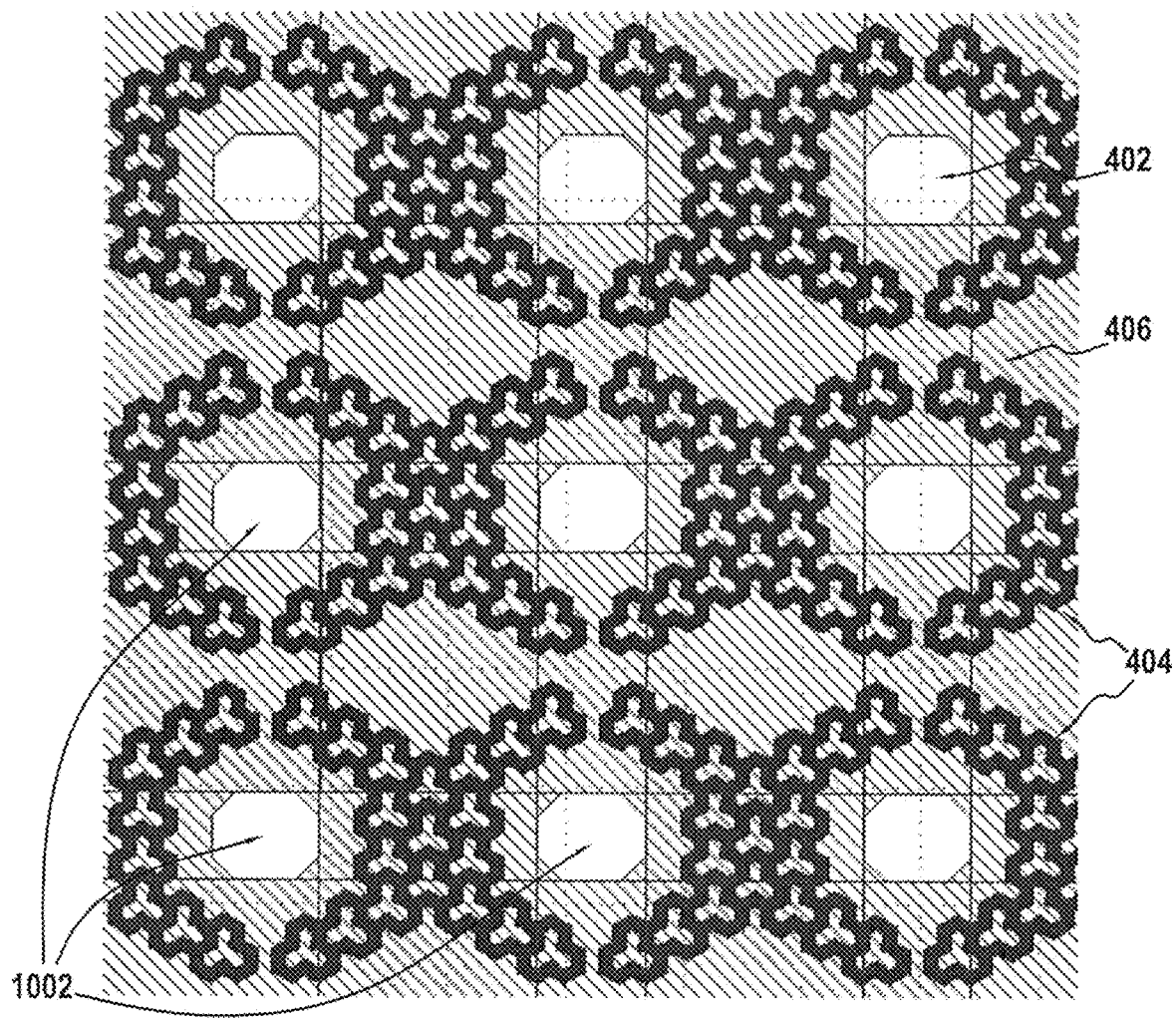

Returning to FIG. 4, after a first insulator layer (not shown) is disposed on top of first conductive layer 404, second conductive layer 406 is disposed on top of the first insulator layer, and into the trenches formed by trench pattern 404, according to the shown pattern. In an exemplary embodiment, the first insulator layer and second conductive layer 406 form a first insulator-metal structure of the LC filter structure. As shown in FIG. 4, second conductive layer 406 is disposed along the entire top surface of the substrate, save for first hexagonal areas that surround a first contact array CA1, disposed to connect first conductive layer 402 to a first metal layer (not shown, discussed further below) of the structure. FIG. 10B illustrates a pattern layout resulting from first conductive layer 402, trench pattern 404, and second conductive layer 406. The first hexagonal areas that surround first contact area CA1 (not shown in FIG. 10B) are denoted by the numeral 1002. As would be understood by a person skilled in the art, areas 1002 may have other than a hexagonal shape, such as a square, rectangular, or circular shape for example.

Returning to FIG. 4, a second insulator layer (not shown) is then disposed on top of second conductive layer 406, and third conductive layer 408 is disposed on top of the second insulator layer. Third conductive layer 408 is disposed into the trenches formed by trench pattern 404. In an embodiment, the second insulator layer and third conductive layer 408 form a second insulator-metal structure of the LC filter structure. As shown in FIG. 4, third conductive layer 408 is disposed along the entire top surface of the substrate, save for second hexagonal areas that surround the first contact array CA1 (the second hexagonal areas encompass the first hexagonal areas formed by the absence of second conductive layer 406) and third hexagonal areas that surround a second contact array CA2 disposed to connect second conductive layer 406 to a second metal layer (discussed further below) of the structure.

Figure 10C:
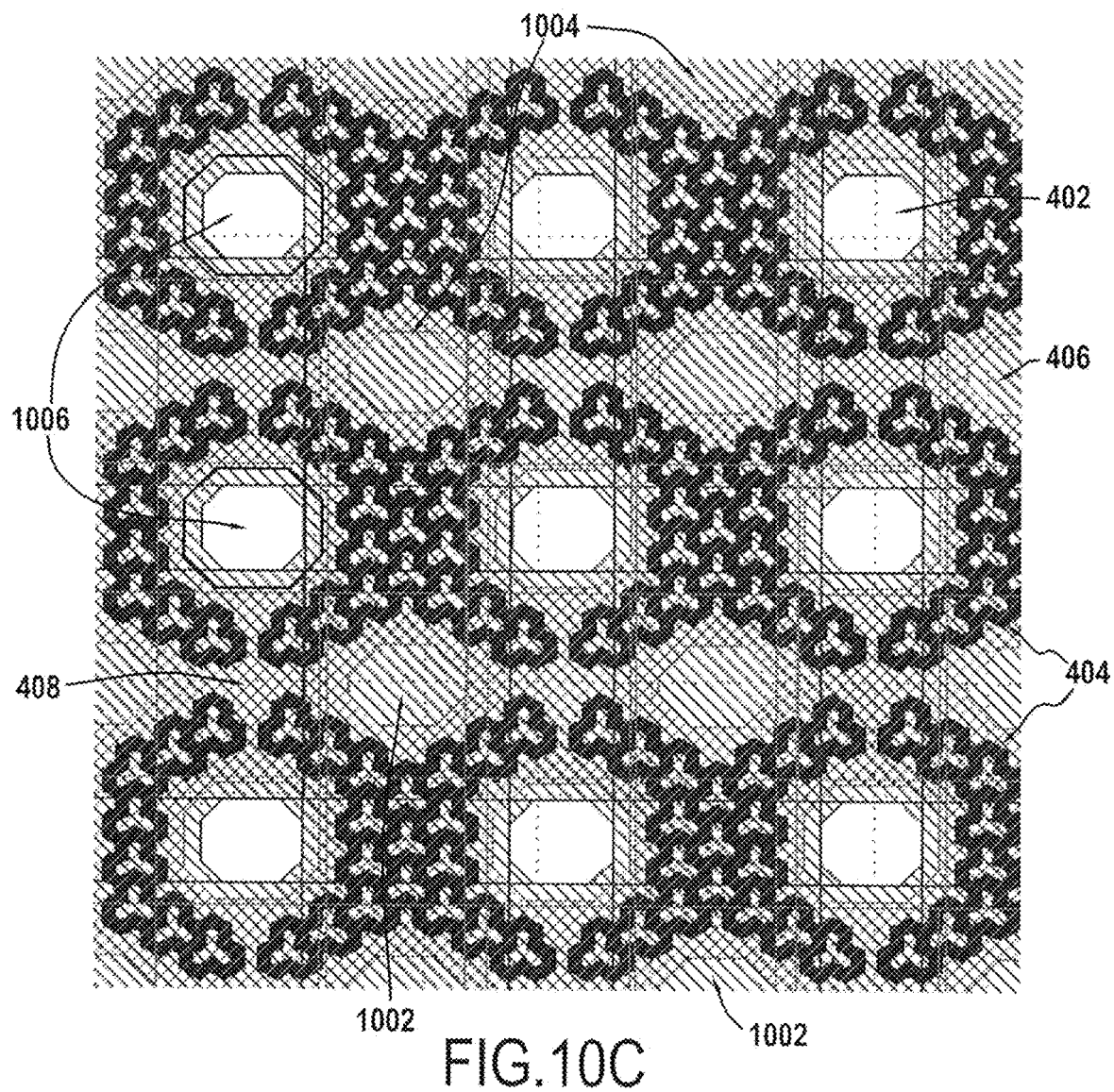

FIG. 10C illustrates a pattern layout resulting from first conductive layer 402, trench pattern 404, second conductive layer 406, and third conductive layer 408. The second hexagonal areas are denoted by the numeral 1006 and the third hexagonal areas are denoted by the numeral 1004. As would be understood by a person skilled in the art, areas 1004 and/or 1006 may have other than a hexagonal shape, such as a square, rectangular, or circular shape for example.

Figure 10D:
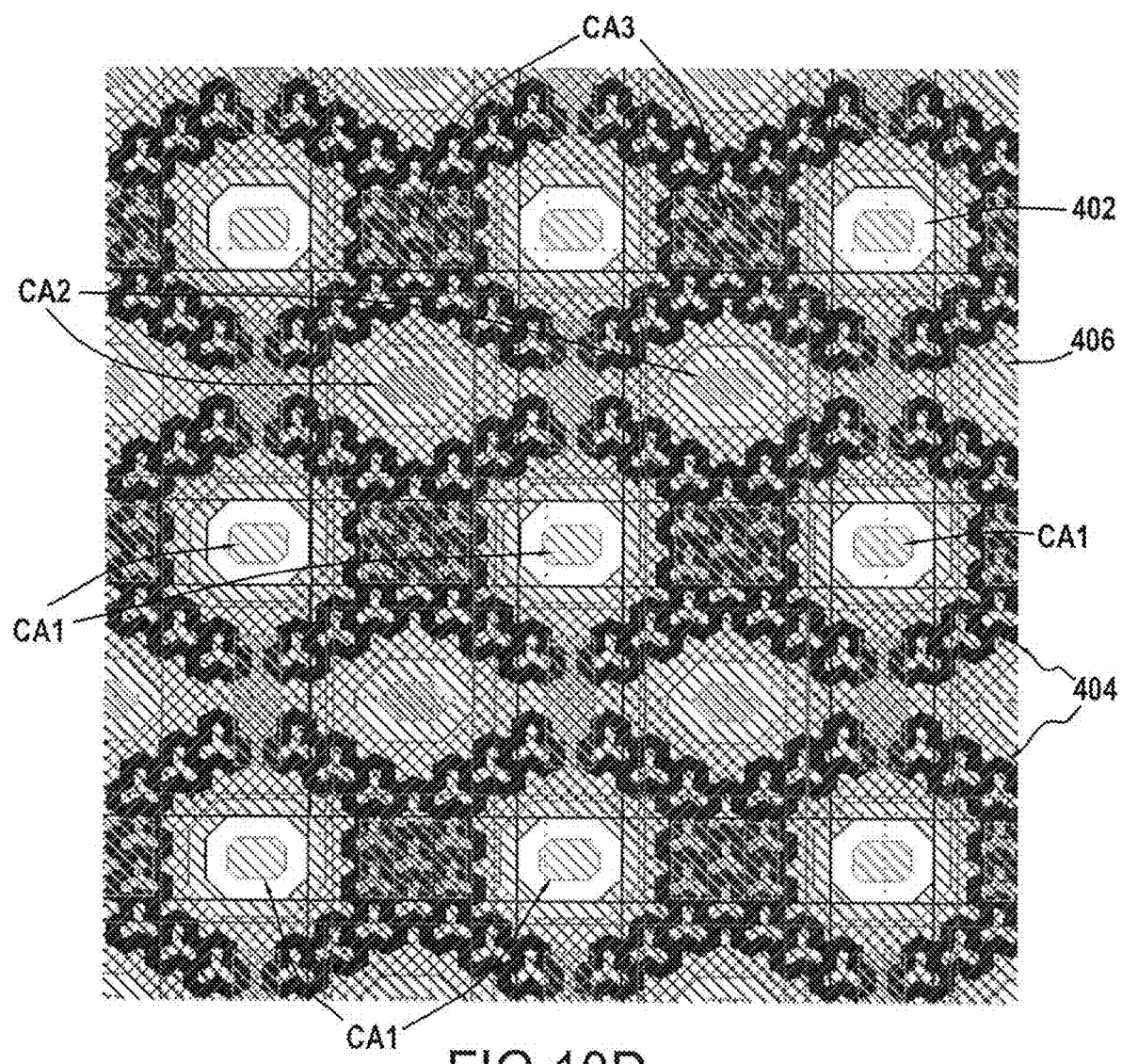

Returning to FIG. 4, a third contact array CA3 is then disposed to connect third conductive layer 408 to the first metal of the structure as shown by the pattern CA3. FIG. 10D illustrates a pattern layout resulting from first conductive layer 402, trench pattern 404, second conductive layer 406, third conductive layer 408, first contact array CA1, second contact array CA2, and third contact array CA3. In an embodiment, first contact array CA1, second contact array CA2, and third contact array CA3 have equal contact density (defined as the number of contacts per surface unit). In another embodiment, first contact array CA1, second contact array CA2, and third contact array CA3 have equal contact surface (defined as the cumulative surface of contacts per surface unit). In a further embodiment, first contact array CA1, second contact array CA2, and third contact array CA3 have equal contact pitch (defined as the distance in between the contacts). In an embodiment, as shown in FIG. 10D, first contact array CA1 is staggered relative to second contact array CA2 and aligned horizontally with third contact array CA3, which is aligned vertically with second contact array CA2.

FIG. 5 is a top view of a second pattern layout 500 of an example distributed LC filter structure according to an exemplary embodiment. Second pattern layout 400 shows the layouts of a first metal layer 502, a second metal layer 504, and an inter-metal insulation layer of the LC filter structure. Second pattern layout 500 is a complementary layout to first pattern layout 400 shown in FIG. 4, with second pattern layout 500 formed above first pattern layout 400 in the distributed LC filter structure.

For ease of presentation, first conductive layer 402 is shown in FIG. 5 as it defines the bottom most layer of the structure.

In an exemplary embodiment, first metal layer 502 is deposited on top of a first insulation layer (not shown), which is deposited along the top surface of the substrate. In an embodiment, the first insulation layer is deposited along the entire top surface of the substrate, except in areas corresponding to the aggregate pattern formed by first contact array CA1, second contact array CA2, and third contact array CA3.

As shown in FIG. 5, first metal layer 502 has a pattern that corresponds to the top surface of the substrate, save for areas in which the pattern is interrupted to form hexagonal shaped islands.

Figure 10E:
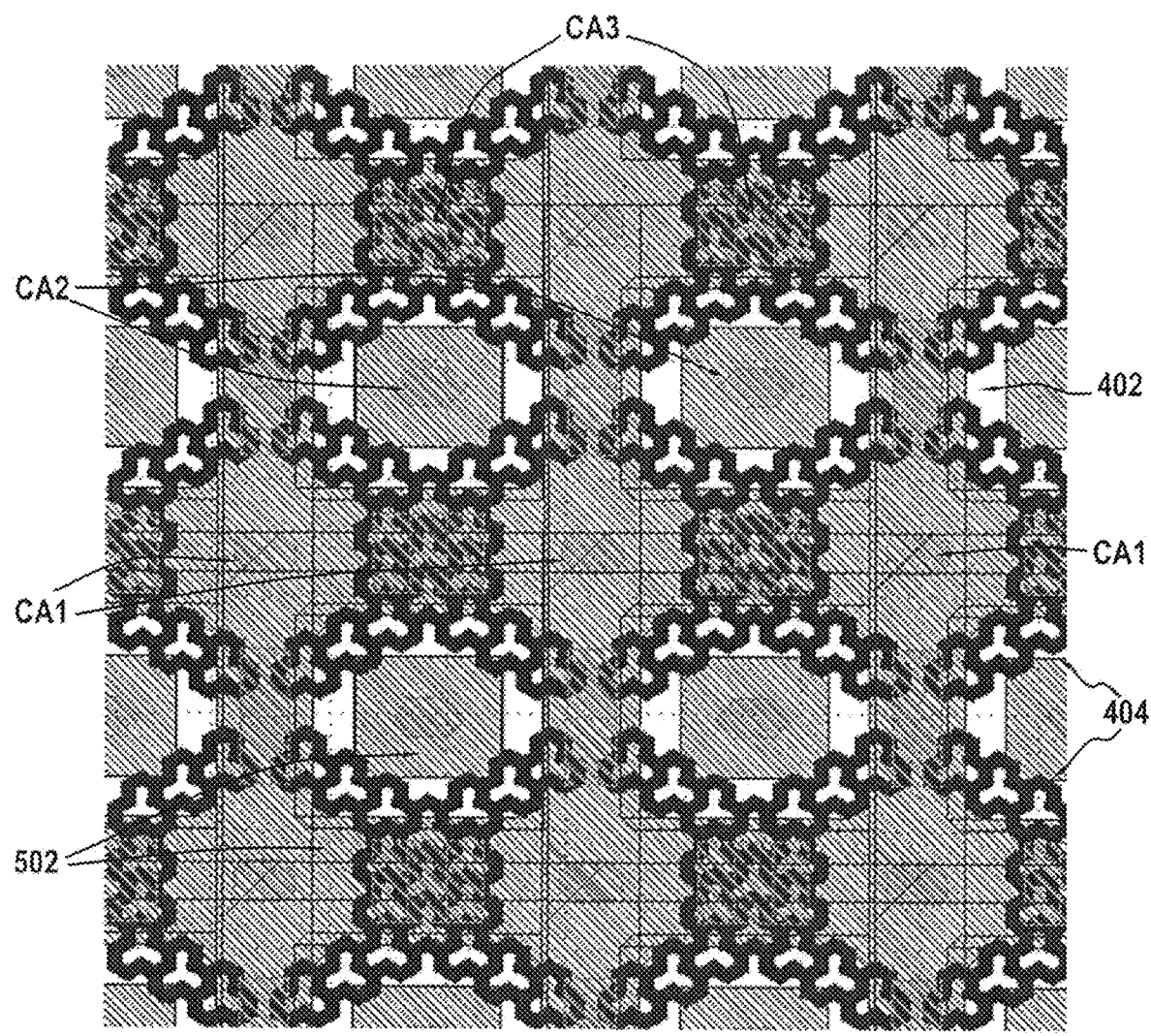

FIG. 10E illustrates a pattern layout resulting from first conductive layer 402, trench pattern 404, first metal layer 502, first contact array CA1, second contact array CA2, and third contact array CA3. In this pattern layout, first metal layer 502 includes islands that are rectangular shaped, instead of hexagonal shaped as in FIG. 5.

Returning to FIG. 5, a second insulation layer (inter-metal dielectric) is then formed on top of first metal layer 502. In FIG. 5, the second insulation layer is formed along the entire surface of the substrate except for square openings defined by pattern 506. In an embodiment, pattern 506 corresponds to the location of second contact array CA2, which as mentioned above, connects second conductive layer 506 to second metal layer 504.

Figure 10F:
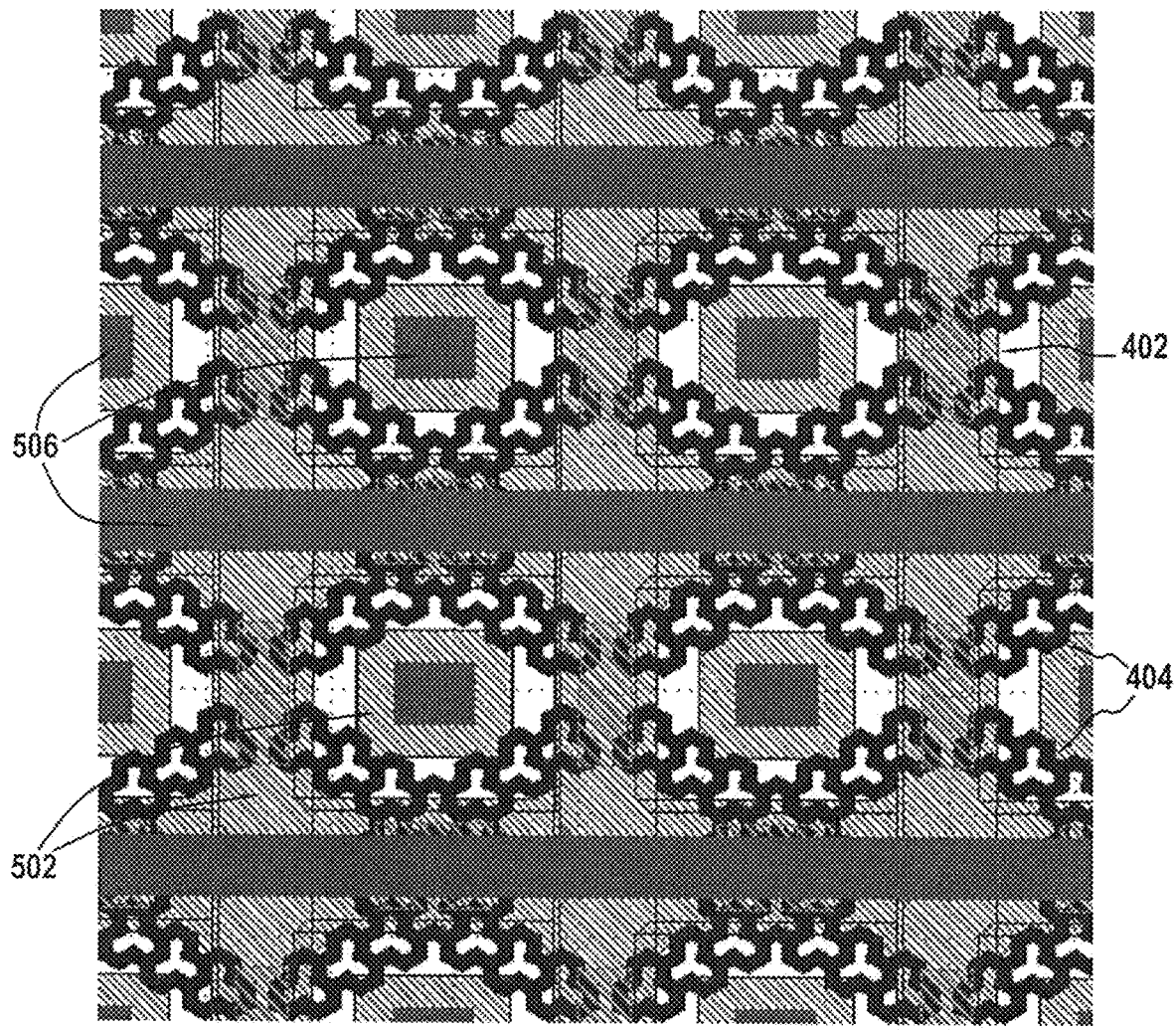

A pattern layout resulting from first conductive layer 402, trench pattern 404, first metal layer 502, and the second insulation layer is shown in FIG. 10F according to an exemplary embodiment. As shown in FIG. 10F, in this embodiment, the pattern 506 further includes bands in which the second insulation layer is also interrupted.

Figure 10G:
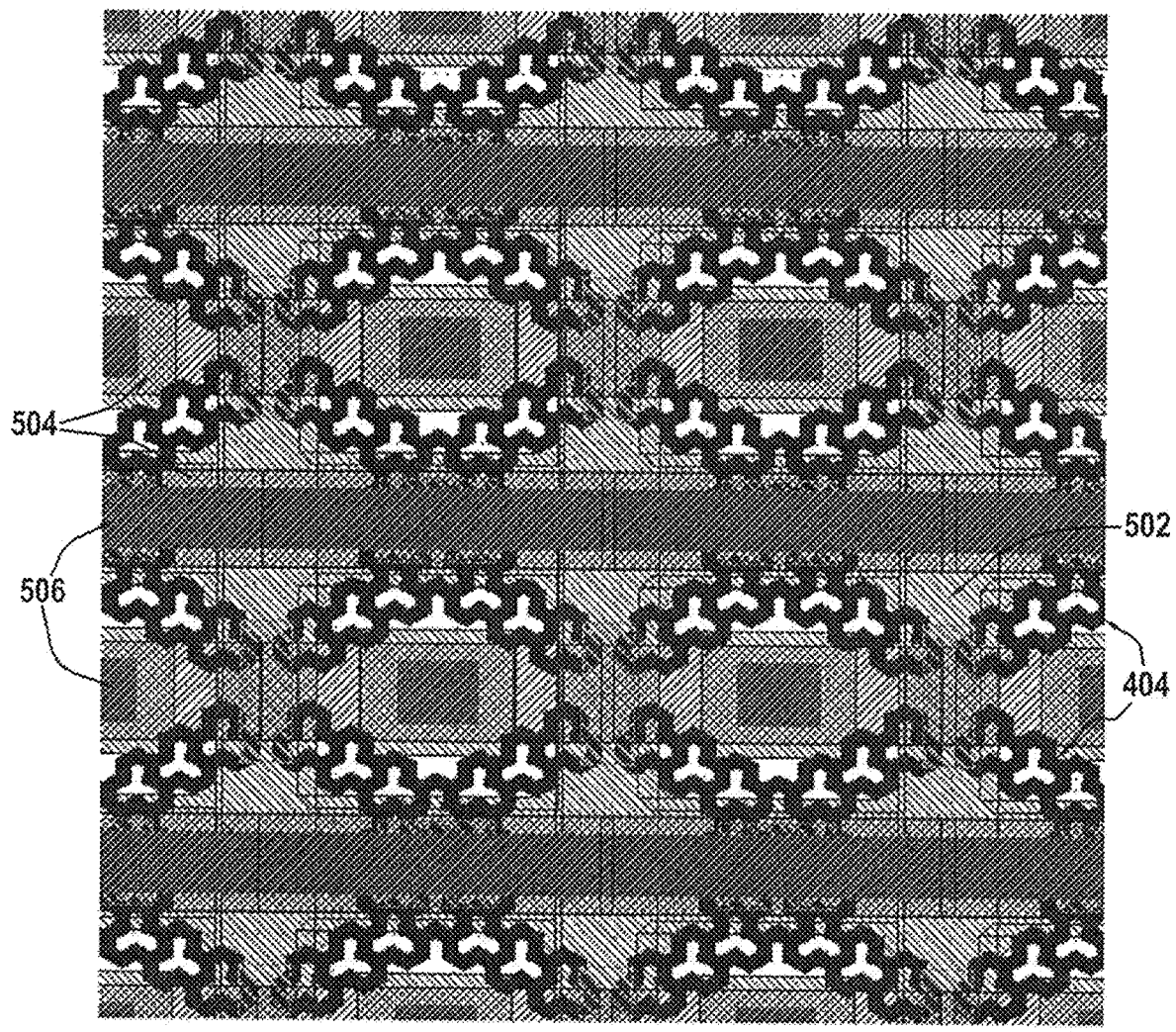

Returning to FIG. 5, second metal layer 504 is then deposited on top of the second insulation layer. As shown in FIG. 5, second metal layer 504 has a linear shape with a length (l) and a width (W) with 1 being larger than W by a factor of at least 100. A pattern layout resulting from trench pattern 404, first metal layer 502, second metal layer 504, and the second insulation layer is shown in FIG. 10G.

In an exemplary embodiment, second metal layer 504 serves to provide a distributed inductance of the distributed LC filter structure. The inductance value L is related to the length 1 and the width W by the equation L=f(l/W), where f represents the frequency. In other embodiment, second metal layer 504 can have different layouts, like a meander pattern, a planar loop, or a spiral.

Figure 6:
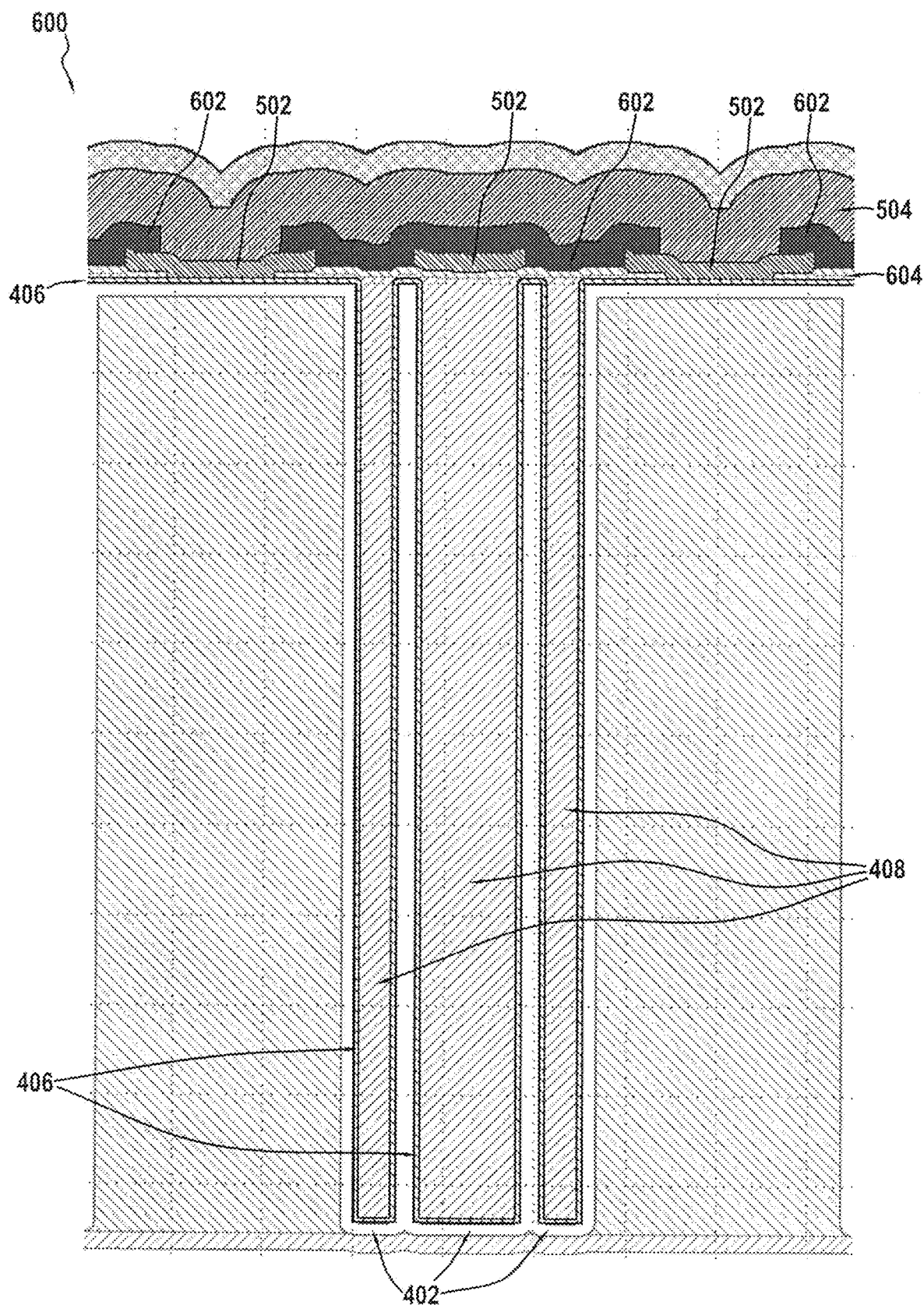
FIG. 6 is a cross section view of an example distributed LC filter structure according to an exemplary embodiment.

FIG. 6 is a cross section view 600 of an example distributed LC filter structure according to an embodiment. In an exemplary embodiment, cross section view 600 corresponds to a cross section of the LC filter structure illustrated in FIGS. 4 and 5 above along the line C-C' shown in FIG. 5.

As shown in FIG. 6, first conductive layer 402, second conductive layer 406, and third conductive layer 408 are disposed in a trench. First conductive layer 402 and second conductive layer 406 are separated by the first insulator layer (not shown), and second conductive layer 406 and third conductive layer 408 are separated by the second insulator layer (not shown).

Layer 604 corresponds to the first insulation layer (first inter-metal dielectric) which is deposited above third conductive layer 408. Layer 604 is deposited along the top surface of the substrate except for openings through which first, second, and third contact arrays CAL CA2, and CA3 extend vertically to contact first conductive layer 402, second conductive layer 406, and third conductive layer 408, respectively. In other words, the pattern of layer 604 is the complement of the aggregate pattern of contact arrays CAL CA2, and CA3. In FIG. 6, two openings through layer 602 corresponding to second contact array CA2 can be seen.

First metal layer 502 is disposed above layer 604 according to the pattern discussed above with respect to FIG. 5. Layer 602 corresponds to the second insulation layer (second inter-metal dielectric) which is deposited above first metal layer 502. As shown, layer 602 is deposited along the top surface of the substrate except for square openings corresponding to pattern 506 in FIG. 5. This allows second metal layer 504 to contact second conductive layer 406.

Figure 7:
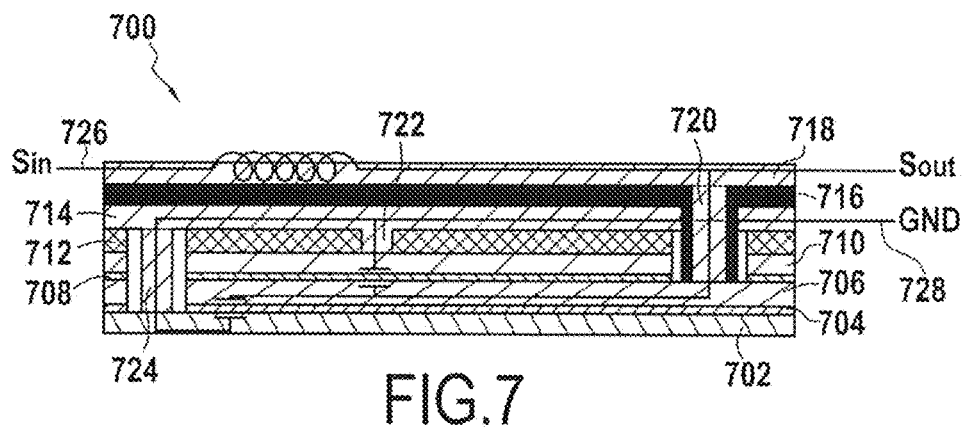
FIG. 7 is a cross section view of an example distributed LC filter structure according to an exemplary embodiment.

FIG. 7 is a cross section view 700 of an example distributed LC filter structure according to an exemplary embodiment. In an embodiment, cross sectional view 700 corresponds to a cross section of the LC filter structure described with reference to FIGS. 4 and 5 above. For ease of presentation, trenches are not shown in cross section view 700.

As shown in FIG. 7, the distributed LC filter structure includes a first conductive layer 702, a first insulator layer 704, a second conductive layer 706, a second insulator layer 708, a third conductive layer 710, a first insulation layer 712, a first metal layer 714, a second insulation layer 716, a second metal layer 718, a first contact array 724, a second contact array 720, and a third contact array 722.

In an exemplary embodiment, first conductive layer 702, second conductive layer 706, third conductive layer 710, first metal layer 714, second metal layer 718, first contact array 724, second contact array 720, and third contact array 722 correspond respectively to first conductive layer 402, second conductive layer 406, third conductive layer 408, first metal layer 502, second metal layer 504, first contact array CA1, second contact array CA2, and third contact array CA3 described with reference to FIGS. 4, 5, and 6 above.

In an exemplary embodiment, first conductive layer 702 is disposed on a top surface of a substrate (not shown). In another embodiment, the substrate has a trench etched in its top surface and first conductive layer 702 is disposed into the trench.

First insulator layer 704 is disposed on top of first conductive layer 702, and second conductive layer 706 is disposed on top of first insulator layer 704. In an exemplary embodiment, first insulator layer 704 and second conductive layer 706 form a first insulator-metal structure of the distributed LC filter structure. In an embodiment, the first insulator-metal structure is disposed in the trench etched into the substrate.

Second insulator layer 708 is disposed on top of second conductive layer 706, and third conductive layer 710 is disposed on top of second insulator layer 708. In an embodiment, second insulator layer 708 and third conductive layer 710 form a second insulator-metal structure of the distributed LC filter structure. In an embodiment, the second insulator-metal structure is also disposed in the trench etched into the substrate.

First insulation layer 712 is deposited along the top surface of the substrate above third conductive layer 710, and first metal layer 714 is deposited on top of the first insulation layer 712. First contact array 724 is formed to connect first metal layer 714 to first conductive layer 702, and third contact array 722 is formed to connect first metal layer 714 to third conductive layer 710.

Second insulation layer 716 is deposited on top of the first metal layer 714, and second metal layer 718 is deposited on top of the second insulation layer 716. Second contact array 720 is formed to connect second metal layer 718 to second conductive layer 706. In an embodiment, second metal layer 718 provides an inductance of the distributed LC filter structure.

In an exemplary embodiment, first conductive layer 702, second conductive layer 706, and third conductive layer 710 provide first, second, and third electrodes, respectively, which form a first capacitive cell of the distributed LC filter. As shown in FIG. 7, the first capacitive cell includes a first capacitance formed by the first and second electrodes and a second capacitance formed by the second and third electrodes. Because the first and third electrodes are both connected to first metal layer 714, the first capacitance and the second capacitance are in parallel.

In another exemplary embodiment, the first, second, and third electrodes form a second capacitive cell (not shown) of the distributed LC filter, in parallel with the first capacitive cell. In cross section view 700 of FIG. 7, the second capacitance cell would be located to the left or the right of the shown first capacitance cell.

Figure 9:
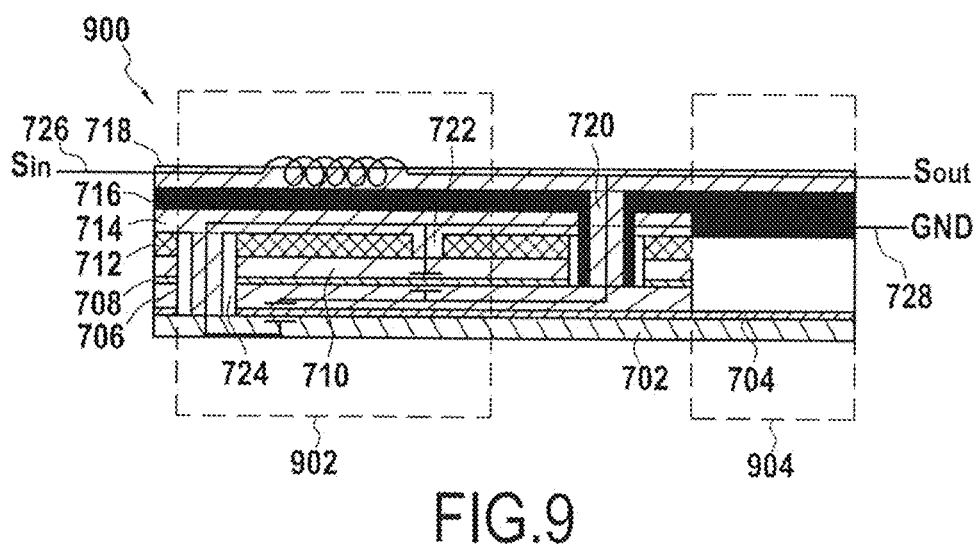
FIG. 9 is a cross section view of an example distributed LC filter structure according to an exemplary embodiment.

In a further exemplary embodiment, parallel capacitive cells underlie the entire length of second metal layer 718 to create a uniformly distributed structure. In another embodiment, the capacitive cells underlie only a portion of second metal layer 718 to create a non-uniformly distributed structure. For example, FIG. 9 is a cross section view 900 of a non-uniformly distributed LC filter structure according to an embodiment. As shown in FIG. 9, the capacitive cells are provided in a portion 902 and discontinued in a portion 904 of the structure. As such, in portion 904, only an inductance is formed. The resulting structure is therefore an LC+L structure. As would be understood by a person of skill in the art based on the teachings herein, other structures can be formed by forming/interrupting the formation of capacitive cells in one or more portions of the structure. For example, the distributed LC filter structure can be designed to include an L+LC, an LC+L, or an L+LC+L filter structure.

Figure 8:
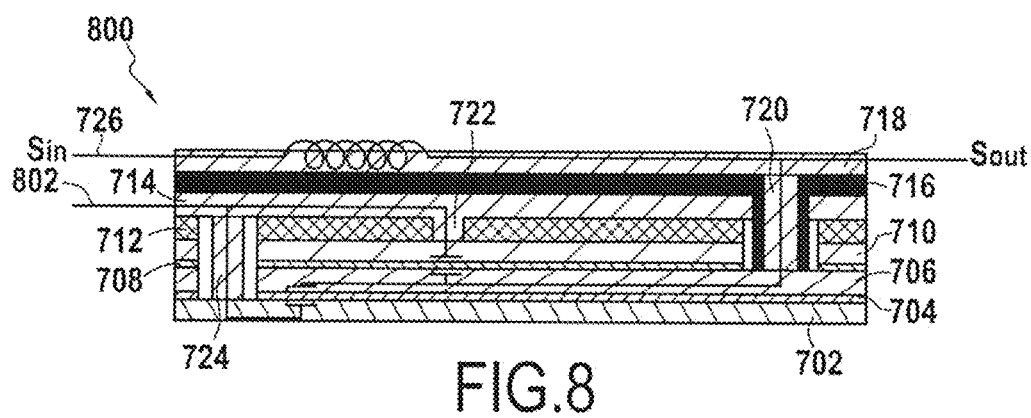
FIG. 8 is a cross section view of an example distributed LC filter structure according to an exemplary embodiment.

In an exemplary embodiment, as shown in FIG. 7 for example, first metal layer 714 is connected to a ground terminal via a ground path 728 and second metal layer 718 is connected to an input signal via a signal path 726. In one implementation, as in FIG. 7, signal connections are designed so as to increase the mutual inductance between the ground path 728 and the signal path 726. In another implementation, shown in FIG. 8, signal connections are designed so as to reduce the mutual inductance between the ground path 802 and the signal path 726.

In another exemplary embodiment, in order to enhance the LC distributed filter structure from an Electromagnetic Interference (EMI) emission point of view, especially at high frequency, a ground plane layer (not shown) is disposed above signal path 726 (i.e., above second metal layer 718). As such, the electromagnetic field is confined and interference with other components is reduced.

In an exemplary embodiment, at least one of the first contact array 724, second contact array 720, and third contact array 722 is configured such that a parasitic inductance of at least one of the first and second capacitive cells is coupled in series with the inductance provided by the second metal layer 718. Alternatively or additionally, at least one of the first contact array 724, second contact array 720, and third contact array 722 may be configured such that a parasitic capacitance of second metal layer 718 is coupled in parallel with the first and second capacitive cells.

In general, exemplary embodiments of the distributed LC filter structure can be tuned to obtain a filter with an equivalent frequency response as a lumped LC filter. Additionally, the distributed capacitive design combined with a creative routing technique between capacitive cells permits a very flexible tuning of the filter envelope. The filter rejection may be increased while maintaining high efficiency and improving output ripples.

In the exemplary embodiments described above, the distributed LC structure has been described for signal filtering use primarily. However, the structure is not limited to filtering applications and can be used in a variety of other applications as would be understood by a person of skill in the art. For example, the structure may be used to provide distributed capacitive decoupling along an interconnection line, a transmission line having strong capacitive coupling to ground, a low-pass single pole filter, or a low-pass cell in a higher pole order filter.

It is noted that the foregoing description of the embodiments will so fully reveal the general nature of the disclosure that others can, by applying knowledge within the skill of the art, readily modify and/or adapt the embodiments for various applications, without undue experimentation, without departing from the general concept of the present disclosure. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims.

What is claimed:

1. A distributed LC filter structure, comprising:
   a substrate having a trench etched in a top surface thereof;
   a first conductive layer disposed in the trench;
   a first insulator-metal structure disposed in the trench on top of the first conductive layer, with the first insulator-metal structure comprising a first insulator layer disposed on the first conductive layer and a second conductive layer disposed on the first insulator layer;
   a second insulator-metal structure disposed in the trench on top of the first insulator-metal structure, with the second insulator-metal structure comprising a second insulator layer disposed on the second conductive layer and a third conductive layer disposed on the second insulator layer;
   a first insulation layer disposed along the top surface of the substrate above the third conductive layer;
   a first metal layer disposed on the first insulation layer;
   a second insulation layer disposed on the first metal layer;
   a second metal layer disposed on the second insulation layer;
   a first contact array connecting the first conductive layer to the first metal layer;
   a second contact array connecting the second conductive layer to the second metal layer; and
   a third contact array connecting the third conductive layer to the first metal layer.

2. The distributed LC filter structure of claim 1, wherein the first conductive layer, the second conductive layer, and the third conductive layer provide first, second, and third electrodes, respectively, that form a first capacitive cell of the distributed LC filter.

3. The distributed LC filter structure of claim 2, wherein the first, second, and third electrodes form a second capacitive cell of the distributed LC filter that is coupled in parallel with the first capacitive cell.

4. The distributed LC filter structure of claim 3, wherein in at least one of the first and second capacitive cells, the first and second electrodes form a first capacitance and the second and third electrodes form a second capacitance, the first capacitance being in parallel with the second capacitance.

5. The distributed LC filter structure of claim 3, wherein the second metal layer provides an inductance of the distributed LC filter structure.

6. The distributed LC filter structure of claim 5, wherein at least one of the first contact array, the second contact array, and the third contact array is configured such that a parasitic inductance of at least one of the first and second capacitive cells is coupled in series with the inductance provided by the second metal layer.

7. The distributed LC filter structure of claim 5, wherein the first and second capacitive cells underlie an entire length of the second metal layer, thereby forming a uniformly distributed LC structure.

8. The distributed LC filter structure of claim 5, wherein the first and second capacitive cells underlie only a portion of a length of the second metal layer.

9. The distributed LC filter structure of claim 8, wherein the distributed LC filter structure includes one of a L+LC, a LC+L, or a L+LC+L filter.

10. The distributed LC filter structure of claim 1, wherein the second metal layer has a length and a width, with the length being larger than the width by a factor of at least 100.

11. The distributed LC filter structure of claim 1, wherein the first metal layer is connected to a ground terminal and the second metal layer is connected to an input signal terminal.

12. The distributed LC filter structure of claim 1, wherein the first contact array, the second contact array, and the third contact array each have an equal contact density with respect to each other.

13. The distributed LC filter structure of claim 1, wherein the first contact array, the second contact array, and the third contact array each have an equal pitch with respect to each other.

14. The distributed LC filter structure of claim 1, wherein the distributed LC filter structure is coupled to a Power Management Integrated Circuit (PMIC) flip-chip bonded onto the substrate.

15. A DC-DC converter comprising a distributed LC filter structure according to claim 1.

16. A distributed LC filter structure, comprising:
a substrate having a trench extending therein;
a first conductive layer disposed in the trench;
a first insulator layer disposed in the trench and on the first conductive layer;
a second conductive layer disposed in the trench and on the first insulator layer;
a second insulator layer disposed in the trench and on the second conductive layer;
a third conductive layer disposed in the trench and on the second insulator layer;
a first insulation layer disposed along a top surface of the substrate and above the third conductive layer;
a first metal layer disposed on the first insulation layer;
a second insulation layer disposed on the first metal layer;
a second metal layer disposed on the second insulation layer; and
a plurality of contact arrays connecting the first, second and third conductive layers to the first, second and third metal layers, respectively.

17. The distributed LC filter structure of claim 16, wherein the first, second and third conductive layers provide a plurality of electrodes that form a first capacitive cell of the distributed LC filter.

18. The distributed LC filter structure of claim 17, wherein the plurality of electrodes form a second capacitive cell of the distributed LC filter that is coupled in parallel with the first capacitive cell.

19. The distributed LC filter structure of claim 18,
wherein the second metal layer provides an inductance of the distributed LC filter structure; and
wherein at least one of the plurality of contact arrays is configured such that a parasitic inductance of at least one of the first and second capacitive cells is coupled in series with the inductance provided by the second metal layer.

20. The distributed LC filter structure of claim 18,
wherein the second metal layer provides an inductance of the distributed LC filter structure,
wherein the first and second capacitive cells underlie only a portion of a length of the second metal layer, and
wherein the distributed LC filter structure includes one of a L+LC, a LC+L, or a L+LC+L filter.

* * * * *